United States Patent [19]

Weitekamp et al.

[11] Patent Number: 4,982,088
[45] Date of Patent: Jan. 1, 1991

[54] METHOD AND APPARATUS FOR HIGHLY SENSITIVE SPECTROSCOPY OF TRAPPED IONS

[75] Inventors: Daniel P. Weitekamp, Altadena; Pedro J. Pizarro, Pasadena, both of Calif.

[73] Assignee: California Institute of Technology, Pasadena, Calif.

[21] Appl. No.: 474,449

[22] Filed: Feb. 2, 1990

[51] Int. Cl.[5] ............................................. G01N 24/14
[52] U.S. Cl. .................................. 250/291; 250/290; 250/281; 250/282
[58] Field of Search ............... 250/291, 292, 293, 290, 250/281, 282; 436/173

[56] References Cited

U.S. PATENT DOCUMENTS

3,973,955  2/1976  Limisarow et al. ................. 250/291
4,563,579  1/1986  Kallerbads et al. ................. 250/291
4,686,365  8/1987  Meek et al. ......................... 250/291
4,755,670  7/1988  Syka et al. ......................... 250/291

Primary Examiner—Jack I. Berman
Assistant Examiner—Kiet T. Nguyen
Attorney, Agent, or Firm—Leonard Tachner

[57] ABSTRACT

An apparatus and method are disclosed for detection of spectra of internal transitions via ion cyclotron resonance techniques. Details of ion containment in a Penning trap and coupling of spin to spatial motions by the addition of a magnetic bottle field are described in both calssical and quantum mechanical formalisms. The invention alters the axial motion of a single ion with a train of spin flips and monitors magnetic resonance through changes in the cyclotron frequency. Detection of such a signal for a single ion (or a small cloud) provides a sensitivity increase of ten to twenty orders of magnitude over conventional magnetic resonance techniques.

20 Claims, 5 Drawing Sheets

METHOD AND APPARATUS FOR HIGHLY SENSITIVE SPECTROSCOPY OF TRAPPED IONS

TECHNICAL FIELD

The present invention relates generally to ion spectroscopy and more specifically to an apparatus and method for high sensitivity ion spectroscopy using trapped-ion techniques to observe highly discriminating spectra of internal transitions.

BACKGROUND ART

The study of ions by cyclotron resonance techniques continues to expand almost sixty years after its introduction. The many types of cyclotron experiments all rely on the calculation of ion mass from its inverse relationship to the measured cyclotron frequency in a given magnetic field. Earlier ion cyclotron resonance (ICR) experiments scanned through a single frequency at a time and were, thus, relatively time consuming. The advent of more sensitive detection electronics and fast Fourier transformation by computers led to Fourier transform ion cyclotron resonance (FT/ICR) experiments, which obtain the entire frequency spectrum at once. Chemical interest in ICR goes well beyond mass spectrometry. The ion selectivity afforded by double resonance techniques, where certain ions are purged from the cell by ICR excitation while other ions are monitored, is useful in observing reaction rates. All ICR experiments rely on the ion trapping due to cyclotron motion. The magnetic field confines ions transversely in cyclotron orbits, and the addition of electrostatic plates leads to harmonic axial motion. This combination of electric and magnetic fields keeps ions trapped as long as several seconds in typical chemical applications. To study single trapped ions, however, physicists employ precise field configurations such as the Penning trap: a single electron has been trapped for as long as ten months.

While ICR and related techniques are highly sensitive, the only observable they measure is mass. Conventional ICR thus cannot distinguish two structurally different species of equal mass. This is in marked contrast to nuclear magnetic resonance (NMR) and electron spin resonance (ESR), which yield a wealth of information from low-energy spectral features, but have poor sensitivity. This is a basic problem of experimental chemical physics and extends to other forms of spectroscopy; discrimination and sensitivity seem incompatible.

Because of the long collisionless periods obtainable, high resolution optical spectroscopy of trapped ions is an active area of research. It relies on spontaneous emission and photon counting, neither of which are practical at the low frequencies of primary interest here. More closely related to the present invention is work in which electrical signals associated with the ion motion have been used to detect spectroscopic events at low frequencies where direct spectroscopy is impractical. One way this has been achieved is to electrically detect the loss of ions that results from spin-dependent ion loss from a spin-polarized ensemble of ions. Dehmelt and Majors detected the ESR of He ions in this way in an rf quadrupole trap using collisions with a polarized Cs atom beam. In a conceptually related scheme, Richardson, Jefferts and Dehmelt obtained ESR spectra of $H_2^+$ by taking advantage of the spin-dependence of photodissociation in this molecule.

The experiment most similar to the present invention is the detection of the ESR of a single electron by Van Dyck, Wineland, Ekstrom and Dehmelt. In this work a magnetic bottle field was superimposed on a Penning trap and the axial motion of a trapped electron at 4.2K was monitored as spin flips were induced with microwaves. A spin flip from one spin state to the other showed up as a shift in the axial frequency. The magnitude of this frequency shift was about 1 Hz, near the resolution limit of the technique. Since the observed shift is predicted to be inversely proportional to particle mass, it would be difficult or impossible to do this experiment on an ion.

The present invention also uses frequency shifts in ion motion induced by a magnetic bottle to detect the internal spectroscopy of trapped charged particles. It differs from the electron experiments in several important ways. First, the ion motion detected is the cyclotron motion, rather than the axial motion. This is preferable because it has the highest frequency (making it easier to detect with adequate signal-to-noise ratio) and because it provides the best mass resolution. Secondly, the shift detected is not the small one directly associated with the flip of the spin magnetic moment, but rather one associated with a change in the axial motion of the ion. This axial motion is itself made spin-dependent by a second and distinct use of the magnetic bottle field: a sequence of one or more spin flips synchronized with the axial motion is shown to induce a cumulative increase or decrease in the energy of the axial motion depending on the initial spin state.

The following prior art references provide background information relevant to the present invention.
1. Lawrence, E. O. and M. S. Livingston, Phys. Rev. 40: 19 (1932).
2. Beauchamp, J. L., Ann. Rev. Phys. Chem. 22: 527 (1971).
3. Sharp, T. E., J. R. Eyler, and E. Li, Int. J. Mass Spectrom. Ion Phys. 9: 421 (1972).
4. Marshall, A. G., Acc. Chem. Res. 18: 316 (1985).
5. Comisarow, M. B., Anal. Chim. Acta 178: 1 (1985).
6. Anders, L. R., J. L. Beauchamp, R. C. Dunbar, and J. D. Baldeschwieler, J. Chem. Phys. 45: 1062 (1966).
7. Beauchamp, J. L., and J. T. Armstrong, Rev. Sci. Inst. 40: 123 (1969).
8. Penning, F. M., Physica (Utrecht) 3: 873 (1936).
9. Gabrielse, G., H. Dehmelt, and W. Kells, Phys. Rev. Lett. 54: 537 (1985).
10. Brown, L. S., and G. Gabrielse, Rev. Mod. Phys. 58: 233 (1986).
11. Gabrielse, G., and H. Dehmelt, Phys. Rev. Lett. 55: 67 (1985).
12. Purcell, E. M., Electricity and Magnetism, 2nd ed. (McGraw-Hill, New York), 1985.
13. Hartmann, H. and K. -M. Chung, Theoret. Chim. Acta (Berl.) 45: 137 (1977); Schuch, D., K. -M. Chung, and H. Hartmann, Lect. Notes in Chem. 31: 514 (1982).
14. Laukien, F. H., Int. J. Mass Spectrom. Ion Processes 73: 81 (1986).
15. Goldstein, H., Classical Mechanics, 2nd ed. (Addison-Wesley, Reading), 1980.
16. Sakurai, J. J., Modern Quantum Mechanics (Benjamin/Cummings, Menlo Park), 1985.
17. Van Dyck, R. S., F. L. Moore, D. L. Farham, and P. B. Schwinberg, Rev. Sci. Inst. 57: 593 (1986).

18. Zonneveld, J. A., Automatic Numerical Integration (Mathematical Centre Tracts, vol. 8, Mathematisch Centrum, Amsterdam), 1964.
19. Press, W. H., B. P. Flannery, S. A. Teukolsky, and W. T. Vetterling, Numerical Recipes (Cambridge University Press, Cambridge), 1986.
20. Sanchez, D. A., R. C. Allen and W. T. Kyner, Differential Equations (Addison-Wesley, Reading, MA), 1983.
21. Gabrielse, G., Phys. Rev. A 27: 227 (1983).
22. Gabrielse, G., and F. C. MacKintosh, Int. J. Mass Spectrom. Ion Processes 57: 1 (1984).
23. Comisarow, M. B., Lect. Notes in Chem. 31: 484 (1982).
24. Schmidt, G., Physics of High Temperature Plasmas, 2nd ed. (Academic Press, New York), 1979.
25. Richardson, C. B., K. B. Jefferts and H. G. Dehmelt, Phys. Rev. 165: 80 (1968).
26. Jefferts, K. B., Phys. Rev. Lett. 20: 39 (1968).
27. Dehmelt, H. G. and F. G. Major, Phys. Rev. Lett. 8: 213 (1962).
28. Van Dyck, R. S., Jr., D. J. Wineland, P. A. Ekstrom and H. G. Dehmelt, Appl. Phys. Lett. 28: 446 (1976).
29. Brown, L. S., G. Gabrielse, J. Tan and K. C. D. Chan, Phys. Rev. A 37: 4163 (1988).
30. Jefferts, S. R. and F. L. Walls, Rev. Sci. Instrum. 60: 1194 (1989).
31. Enge E. and M. Bloom, Can. J. Phys. 48: 2466 (1970).
32. Cornell, E. A., R. M. Weisskoff, K. R. Boyce, R. W. Flanagan, Jr., G. P. Lafyatis and D. E. Pritchard, Phys. Rev. Lett. 63: 1674 (1989).

SUMMARY OF THE INVENTION

The present invention overcomes the noted deficiencies of the prior art by providing an apparatus and method for ion spectroscopy in which discrimination and extreme sensitivity become compatible. More particularly, in the present invention spectroscopy of ions employs the fine sensitivity of trapped-ion techniques to observe highly discriminating magnetic resonance spectra. The case of spin ½ ions is treated here for concreteness and relative theoretical ease, but the results derived may be extended to more complex magnetic characteristics and to the rotational spectroscopy of ions.

The embodiment disclosed deals with a paramagnetic (spin ½) ion confined in a Penning trap. The invention is described for the case of a single ion, but may be extended to small clouds of ions (e.g., 10 to 100 ions). The motion of the ion is explained both classically and quantum mechanically. These results are then modified by the addition of a spatially dependent magnetic bottle field, which couples spin to the spatial degrees of freedom. Experiments are described whereby magnetic transitions may be observed by monitoring changes in spatial quantities, for example, the ion cyclotron frequency. A preferred embodiment of the apparatus and method are disclosed hereinafter in detail sufficient to enable those having ordinary skill in the relevant art to make and use the invention.

OBJECTS OF THE INVENTION

It is therefore a principal object of the present invention to provide an apparatus and method for detection of magnetic resonance spectra by means of ion cyclotron resonance techniques.

It is an additional object of the present invention to provide an apparatus and method for highly improved sensitive detection of one or more trapped ions by using a Penning trap and a magnetic bottle field to alter the axial motion of an ion with a train of spin flips and then monitoring magnetic resonance by measuring changes in cyclotron frequency.

It is still an additional object of the present invention to provide an entirely new method and apparatus for making ion cyclotron resonance measurements capable of distinguishing between structurally different species of equal mass by altering the axial motion of trapped ions with a train of spin flips and then detecting magnetic transitions by monitoring changes in ion cyclotron frequency.

It is still an additional object of the present invention to provide a novel technique of magnetic resonance ion spectroscopy which is ten to twenty orders of magnitude more sensitive than conventional magnetic resonance techniques.

It is still an additional object of the present invention to provide a novel technique of magnetic resonance spectroscopy of isolated ions which is capable of achieving the natural linewidth of the transitions observed.

It is still an additional object of the present invention to provide a method for observing the position and momenta of individual trapped ions and small changes in these quantities by the novel method of observing their individual motional frequencies in an inhomogeneous magnetic field.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which:

FIG. 3, comprising

FIG. 5, comprising

DETAILED DESCRIPTION OF A PREFERRED EMBODIMENT

I. Ion cyclotron motion in the Penning trap: classical mechanics

The general equation of motion of a charged particle of mass m in an electromagnetic field (ignoring spin) is (using the mks system of units)

$$\frac{d^2r}{d^2t} = \frac{q}{m}(E + v + B) \quad [1]$$

where r represents the ion coordinates, t is time, q is the ionic charge, E is the electric field, v is the ion velocity, and B is the magnetic field. In the case of zero electric field and a homogeneous, time-independent magnetic field $B = B_0 z$, ion motion is unrestricted along the field, and confined to a circular oscillation perpendicular to the field at the cyclotron frequency, $$\omega_c = \frac{qB_o}{m}. \qquad [2]$$

The direction of rotation is clockwise for a positively charged ion (looking along the $-z$ direction). The cyclotron motion thus creates a two-dimensional trap. To complete the trapping in all three dimensions, it is useful to apply a steady electric field along the z direction by placing flat plates of potential $V_o$ perpendicular to the magnetic field (at $\pm z_o$), such that $qV_o > 0$. The ion will then be kept confined to $-z_o \leq z \leq z_o$ as long as its axial energy is not greater than the electrostatic repulsion at the edges of the trap.

Conventional ICR cells utilize such flat plates to make cubic or rectangular cells. Since the electric field near the center of these cells is nearly quadrupolar, the axial motion is harmonic. Ion traps consisting of a cylindrical center ring and flat endcaps have also been used for ICR. The electrostatic field and the resulting ion motions for these cell types are similar. They may both be viewed as approximations to the Penning trap described in detail below. Thus, the results derived for the Penning geometry apply also to the other trap types with a degree of accuracy that depends on the trap details. Since our central results will depend only on the existence, but not the precise value, of small shifts between two measured frequencies, any trap geometry would suffice. The Penning geometry is simply the one for which ideal trapping fields, which make certain analytical results possible, are most exactly realized.

Figure 1:
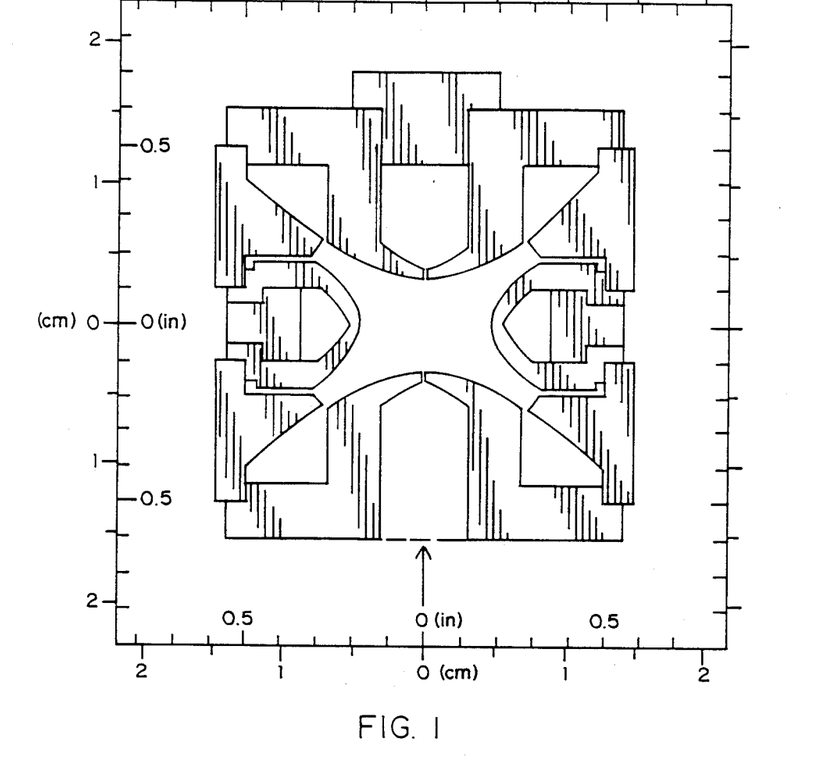
FIG. 1 is a scale drawing of the electrodes of a Penning trap analogous to that used in the present invention.

The Penning trap uses three hyperbolic electrodes (two endcaps and a central ring) to produce a more exactly quadrupolar electric field, as shown in FIG. 1. Small deviations can be corrected with compensation electrodes. The two endcaps are along the two branches of the hyperbola of revolution $$z^2 = z_o^2 + \frac{\rho^2}{2}, \qquad [3a]$$

and the ring electrode lies along the hyperbola of revolution $$z^2 = \frac{\rho^2 - \rho_o^2}{2}. \qquad [3b]$$

The coordinate p is the radial distance of the ion from the z axis; that is, $$\rho^2 = x^2 + y^2. \qquad [4]$$

Defining a characteristic trap dimension d by $$d^2 = \tfrac{1}{2}\left(z_o^2 + \frac{\rho_o^2}{2}\right), \qquad [5]$$

the electric field now takes the form $$E = \frac{V_o}{d^2}\left(\frac{x}{2}x + \frac{y}{2}y - zz\right). \qquad [6]$$

The equations of motion are $$\begin{pmatrix} \frac{d^2x}{dt^2} \\ \frac{d^2y}{dt^2} \\ \frac{d^2z}{dt^2} \end{pmatrix} = \begin{pmatrix} \omega_z^2 x + \omega_c \frac{dy}{dt} \\ \omega_z^2 y - \omega_c \frac{dx}{dt} \\ -\omega_z^2 z \end{pmatrix}, \qquad [7]$$

with $\omega_z$ defined as the angular frequency of the purely harmonic axial motion, $$\omega_z^2 = \frac{qV_o}{md^2}. \qquad [8]$$

The equations are solved analytically by introducing two new transverse components of motion or by introducing trial solutions for x and y that are superpositions of harmonic oscillations at two different frequencies. These give equivalent descriptions of the behavior, namely, that the transverse motion is the superposition of a fast cyclotron motion (at a modified cyclotron frequency, $\omega_+$) and a slower magnetron motion (at the magnetron frequency, $\omega_-$). The relevant frequencies are $$\omega_\pm = \tfrac{1}{2}(\omega_c \pm \sqrt{\omega_c^2 - 2\omega_z^2}\,). \qquad [9]$$

Introducing the transverse vectors $V^{(\pm)}$ such that $$V^{(\pm)} = \frac{d\rho}{dt} - \omega_\mp z \times \rho, \qquad [10]$$

the transverse Hamiltonian of the system can be expressed as $$H_\rho = \frac{m}{2} \frac{\omega_+ V^{(+)2} - \omega_- V^{(-)2}}{\omega_+ - \omega_-} \qquad [11]$$

The cyclotron and axial motions are bound harmonic oscillations. Although harmonic, the magnetron motion is motion around a potential hill, not bound in a potential well, and gives a negative contribution to the total energy. The relative magnitudes of the frequencies are $$\omega_+ >> \omega_z >> \omega_-. \qquad [12]$$

This hierarchy is typically most pronounced for smaller particles. Considering a magnetic field of 1 T, with $V_o = 10$ V and $d = 1$ cm, the respective frequencies $\nu_+$, $\nu_z$, and $\nu_-$ (with $\omega_i = 2\pi\nu_i$) are 28 GHz, 21 MHz, and 8.0 kHz for an electron, 15 MHz, 490 kHz, and 8.0 kHz for a proton, and 145 kHz, 49 kHz, and 8.4 kHz for a 100 amu ion.

II. Ion cyclotron motion in the Penning trap: quantum mechanics

A quantum mechanical description of motion in the Penning trap is possible. This advantageous tool yields new insight into the nature of the physical behavior observed, and makes perturbation estimates of modifications due to more complex fields readily available. Its development arose from the studies of single light particles near rest: an electron or positron at a temperature of 4 K. is not a classical particle and, in particular, its cyclotron motion (more so than the magnetron and axial motions) must be described quantum mechanically. Others have described ICR by building classical oscillators from superpositions of quantum mechanical states. The approach followed here relies only on energy eigenstates to yield perturbation results. The classical limit is obtained by considering large quantum numbers characteristic of the kinetic energies of interest. This provides an easy mechanism to calculate the perturbation of ion motions by modifications of the electric and magnetic fields. Such a treatment will be important below when radially and axially dependent cyclotron frequency shifts due to the addition of a magnetic bottle field are calculated easily through quantum perturbation theory. These and other quantum results can be checked favorably against numerical classical simulations. Thus, quantum and classical mechanics become complementary techniques in the study of trapped ion motions.

A prior art quantum mechanical treatment relies on the raising and lowering operators for the axial, cyclotron, and magnetron degrees of freedom. Since the motions are harmonic, the solution of the quantum harmonic oscillator is readily applied to each case. It is best to begin with the axial motion, since it is an exact harmonic oscillator in one dimension, with Hamiltonian $$H_z = \frac{p_z^2}{2m} + \frac{m\omega_z^2 z^2}{2},$$  [13]

and canonical commutation relation $$[z, p_z] = i\hbar.$$  [14]

The usual creation and annihilation operators are $$a_z^\dagger = \sqrt{\frac{m\omega_z}{2\hbar}}\, z - i\sqrt{\frac{1}{2m\hbar\omega_z}}\, p_z,$$  [15]

$$a_z = \sqrt{\frac{m\omega_z}{2\hbar}}\, z + i\sqrt{\frac{1}{2m\hbar\omega_z}}\, p_z$$

with $[a_z, a_z^\dagger] = 1.$  [16]

Inverting equations (15), $$z = \sqrt{\frac{\hbar}{2m\omega_z}}\,(a_z^\dagger + a_z),\ p_z = -i\sqrt{\frac{m\hbar\omega_z}{2}}\,(a_z - a_z^\dagger).$$  [17]

Substituting equations (17) into the Hamiltonian (13) yields $$H_z = \hbar\omega_z(a_z^\dagger a_z + \tfrac{1}{2})$$  [18]

with the usual orthonormal energy eigenkets $|k>\ k = 0, 1, 2, \ldots$ with corresponding energies $$E_k = \hbar\omega_z(k + \tfrac{1}{2})$$  [19]

and the creation and annihilation relations $$a_z^\dagger|k> = \sqrt{k}\,|k-1>,\ a_z\,|k> = \sqrt{k+1}\,|k+1>.$$  [20]

The transverse Hamiltonian is quantized in complete analogy to the axial Hamiltonian. Cyclotron (+) and magnetron (−) creation and destruction operators are defined from the transverse vectors of equation (10):

$$a_\pm^\dagger = \sqrt{\frac{m}{2\hbar(\omega_+ - \omega_-)}}\,(V_x^{(\pm)} \mp i V_y^{(\pm)});$$  [21a]

$$a_\pm = \sqrt{\frac{m}{2\hbar(\omega_+ - \omega_-)}}\,(V_x^{(\pm)} \pm i V_y^{(\pm)}).$$  [21b]

Inserting these into the classical Hamiltonian (11) reveals the quantum Hamiltonian:

$$H_p = \hbar\omega_+(a_+^\dagger a_+ + \tfrac{1}{2}) - \hbar\omega_-(a_-^\dagger a_- + \tfrac{1}{2}).$$  [22]

$H_p$ is separable into its cyclotron and magnetron components; thus, the transverse energy is the sum of the cyclotron and magnetron energies, and its eigenstates are the direct products of the cyclotron and magnetron energy eigenstates. Using the index n for the cyclotron motion and the index l for the magnetron motion, $$E_{n,l} = \hbar\omega_+(n + \tfrac{1}{2}) - \hbar\omega_-(l + \tfrac{1}{2});$$  [23]

$$|nl> = |n> \times |l>,$$  [24]

with creation and annihilation relations analogous to equations (20). The total Hamiltonian for an ion in a Penning trap is $$H = H_z + H_p,$$  [25]

and the total energy is $$E = E_k + E_{n,l}.$$  [26]

In terms of the operators (21), the transverse coordinates are given by $$x = -i\sqrt{\frac{\hbar}{2m(\omega_+ - \omega_-)}}\,(a_+^\dagger - a_+ + a_-^\dagger - a_-),$$  [27a]

$$y = -\sqrt{\frac{\hbar}{2m(\omega_+ - \omega_-)}}\,(a_+^\dagger + a_+ - a_-^\dagger - a_-);$$  [27b]

$$\rho^2 = \frac{2\hbar}{m(\omega_+ - \omega_-)}\,(a_+^\dagger a_+ + a_-^\dagger a_- +$$  [27c]

$$1 - a_+^\dagger a_-^\dagger - a_+ a_-)$$

and the kinetic momenta are $$p_x = \sqrt{\frac{m\hbar}{2(\omega_+ - \omega_-)}}\,[\omega_+(a_+^\dagger + a_+) - \omega_-(a_-^\dagger + a_-)],$$  [28a]

$$p_y = -i\sqrt{\frac{m\hbar}{2(\omega_+ - \omega_-)}}\,[\omega_+(a_+^\dagger - a_+) + \omega_-(a_-^\dagger - a_-)].$$  [28b]

Equations (17), (27), and (28) can be used to represent any physical observable in terms of the axial, cyclotron, and magnetron creation and destruction operators.

Many typical computations are facilitated by this method, due in large part to the commutation relations applicable here: most commutators vanish, and the only ones that survive are $$[a_i, a_j] = 1, \; i = +, -, k. \quad [29]$$

The usefulness of this technique becomes readily apparent in the following section.

III. Modification of trapped ion motion by a magnetic bottle

A magnetic bottle is an inhomogeneous magnetic field of the form $$\Delta B = B_2 \left[ \left( z^2 - \frac{\rho^2}{2} \right) z - z \rho \right], \quad [30]$$

where $$\rho = xx + yy. \quad [31]$$

In the mks system, $B_2$ has units of $T/m^2$, which are equivalent to $G/cm^2$. The reason for the term "bottle" is obvious when a magnetic moment $\mu$ is aligned along and on the z axis. Then, the correction to the Penning trap Hamiltonian is $$\Delta H(\rho=0, z) = -\mu B_2 z^2, \quad [32]$$

and, for $\mu B_2 > 0$, an axial harmonic potential traps the moment along the z axis. Fields similar to the magnetic bottle arise as inhomogeneities in laboratory magnets; frequency shifts due to such inhomogeneities can be analyzed within the framework of classical mechanics. Laukien calculates the cyclotron frequency shift due to a magnetic bottle (in the limit of axial and magnetron amplitudes small compared to the cyclotron radius $\rho_c$) as $$\Delta \omega_+ = -\frac{q}{2m} B_2 \rho_c^2. \quad [33]$$

The classical equations of motion for an ion in a Penning trap are modified by the presence of a magnetic bottle. The addition of an inhomogeneous field also introduces a spin-dependent force, $F_s$, given by $$F_s = (\mu \cdot \nabla) B. \quad [34]$$

The spin magnetic moment adiabatically follows the instantaneous direction of the total magnetic field, B, and the direction of $\mu$ is parallel to the direction of B, that is, $$\mu = B \quad [35]$$

(where $\mu = \mu \hat{\mu}$ and $\mu$ carries the sign of $\mu$).

The spin-dependent force due to the total magnetic field in this case is $$F_s = \frac{\mu B_2}{|B|} \left[ x \left( -B_o + \frac{B_2}{2} \rho^2 \right) x + y \left( -B_o + \frac{B_2}{2} \rho^2 \right) y + 2z(B_o + B_2 z^2) z \right]. \quad [36]$$

The classical equations of motion (7) now become $$\begin{pmatrix} \frac{d^2 x}{dt^2} \\ \frac{d^2 y}{dt^2} \\ \frac{d^2 z}{dt^2} \end{pmatrix} = \begin{pmatrix} \omega_z^2 x + \left[ \omega_c + \frac{qB_2}{m}\left(z^2 - \frac{\rho^2}{2}\right)\right] \frac{dy}{dt} + \frac{qB_2}{m} yz \frac{dz}{dt} + \frac{\mu B_2}{m|B|}\left(-B_o + \frac{B_2}{2}\rho^2\right)x \\ \omega_z^2 y - \left[ \omega_c + \frac{qB_2}{m}\left(z^2 - \frac{\rho^2}{2}\right)\right] \frac{dx}{dt} - \frac{qB_2}{m} xz \frac{dz}{dt} + \frac{\mu B_2}{m|B|}\left(-B_o + \frac{B_2}{2}\rho^2\right)y \\ -\omega_z^2 z + \frac{qB_2}{m} z \left( x \frac{dy}{dt} - y \frac{dx}{dt} \right) + \frac{2\mu B_2}{m|B|} B_o z + \frac{2\mu}{m|B|} B_2^2 z^3 \end{pmatrix} \quad [37]$$

Due to the extensive coupling of these differential equations, the classical problem has no analytical solution, and may only be solved numerically. A numerical integration is discussed below, but quantum mechanics can provide quick estimates of what a classical simulation should find.

Quantum mechanical perturbation theory is useful here, as long as $B_2 > B_0$ to a reasonable degree. The magnetic bottle adds a perturbation Hamiltonian $\Delta H$ to the Penning trap Hamiltonian (25). It is convenient to restrict this discussion to the case of a spin ½ ion; the results can be extended easily to ions of different spin. The ion will be considered a point particle with mass m and spin ½ due to a paramagnetic electron, with magnetic moment $\pm |\mu_B|$, where $\mu_B$ is the Bohr magneton. If $\sigma$ represents the Pauli spin matrices, the perturbation Hamiltonian is $$\Delta H = \frac{g|\mu_B|}{2} \sigma \cdot \Delta B - qv \cdot \Delta A. \quad [38]$$

$\Delta A$ is the modification to the vector potential. Working in the symmetric gauge, where the vector potential for the homogeneous magnetic field of the Penning trap is $$A = \tfrac{1}{2} B \times \rho, \quad [39]$$

the modification to the vector potential due to the magnetic bottle is $$\Delta A = \tfrac{1}{2} B_2 \left( z^2 - \frac{\rho^2}{4} \right) B \times \rho. \quad [40]$$

Since spin is now included in the problem, spin wavefunctions must be accounted for. The eigenstates $|n\,k\,l\,s\rangle$ of the total system in the absence of the magnetic bottle are direct product states of the cyclotron, axial, magnetron, and spin eigenstates:

$$|nkls\rangle = |n\rangle \times |k\rangle \times |l\rangle \times |s\rangle. \quad [41]$$

Likewise, the total energy $E_{n,k,l,s}$ is the sum $$E_{n,k,l,s} = n\omega_+(n+\tfrac{1}{2}) + n\omega_z(k+\tfrac{1}{2}) - n\omega_-(l+\tfrac{1}{2}) - n\omega_{LO}m_s, \quad [42]$$

with $m_s = \pm\tfrac{1}{2}$, and $\omega_{LO}$ the Larmor frequency of the electron, $$\omega_{LO} = \frac{g|\mu_B|B_o}{\hbar}. \quad [43]$$

Perturbation theory now gives the first order correction to the energy as $$\Delta E_{n,k,l,s} = \langle n\,k\,l\,s|\Delta H|n\,k\,l\,s\rangle. \quad [44]$$

First order frequency shifts associated with quantum number i are then calculated by holding the other three quantum numbers constant and subtracting two adjacent perturbed energy levels of i:

$$\Delta\omega_i = \frac{1}{\hbar}(\Delta E_{i+1} - \Delta E_i). \quad [45]$$

The shifts in the cyclotron, axial, magnetron, and Larmor frequencies are $$\Delta\omega_+ = \frac{B_2}{m(\omega_+ - \omega_-)}\left\{ |\mu_B|g\,m_s + \frac{qh}{m}\left[\frac{\omega_+}{\omega_z}\left(k+\tfrac{1}{2}\right) - \frac{\omega_+ + \omega_-}{\omega_+ - \omega_-}\left(l+\tfrac{1}{2}\right) - \frac{\omega_+}{\omega_+ - \omega_-}(n+1)\right]\right\} \quad [46a]$$

$$\Delta\omega_z = \quad [46b]$$

$$\frac{B_2}{m\,\omega_z}\left\{-|\mu_B|g\,m_s + \frac{qh}{m}\left[\frac{\omega_+}{\omega_+ - \omega_-}\left(n+\tfrac{1}{2}\right) + \frac{\omega_-}{\omega_+ - \omega_-}\left(l+\tfrac{1}{2}\right)\right]\right\}$$

$$\Delta\omega_- = \frac{B_2}{m(\omega_+ - \omega_-)}\left\{|\mu_B|g\,m_s + \frac{qh}{m}\left[\frac{\omega_-}{\omega_z}\left(k+\tfrac{1}{2}\right) - \frac{\omega_+ + \omega_-}{\omega_+ - \omega_-}\left(n+\tfrac{1}{2}\right) - \frac{\omega_-}{\omega_+ - \omega_-}(l+1)\right]\right\} \quad [46c]$$

$$\Delta\omega_{LO} = \quad [46d]$$

$$-\frac{B_2\,g|\mu_B|}{2m}\left[\frac{1}{\omega_z}\left(k+\tfrac{1}{2}\right) - \frac{1}{\omega_+ - \omega_-}(n+l+1)\right].$$

Analysis of these shifts reveals that the magnetic bottle couples each degree of freedom to the other three. Changes in a given quantum number may be monitored by changes in the observed frequency associated with another. This is useful, for example, in the single electron experiments. In a typical laboratory field of 5 T, the electron cyclotron frequency $v_+$ is about 160 GHz, a microwave frequency too high to be observed easily with the current technology. The axial frequency $v_z$ (with $V_o \approx 10$ V and $d \approx 0.3$ cm) is approximately 60 MHz, an easily observable radio frequency. A weak magnetic bottle is thus added, coupling the cyclotron motion to the axial oscillation. Changes in the cyclotron motion, as well as spin flips, are thus monitored by measuring changes in the axial frequency.

A quantum mechanical analogue of the classical cyclotron frequency shift (33) may now be derived. The quantum analogue of the classical radius (squared) of state $|n\,k\,l\,s\rangle$ is the expectation value of the corresponding operator (Equation 27c), $$\rho^2 = \langle nkls|\rho^2|nkls\rangle = \frac{2\hbar}{m(\omega_+ - \omega_-)}(n+l+1). \quad [47]$$

Using the relation $\omega_+ \gg \omega_z \gg \omega_-$ in frequency shift (46a), in the limit of small k, the cyclotron frequency shift is approximately $$\Delta\omega_+ \approx -\frac{q}{2m}B_2\,\rho^2. \quad [48]$$

This quantum perturbation expression is equal to the classical shift (33). However, the quantum expression is also valid for arbitrary k, a fact that will be important for the analysis of the proposed experiments.

IV. The variable magnetic bottle

Figure 2:
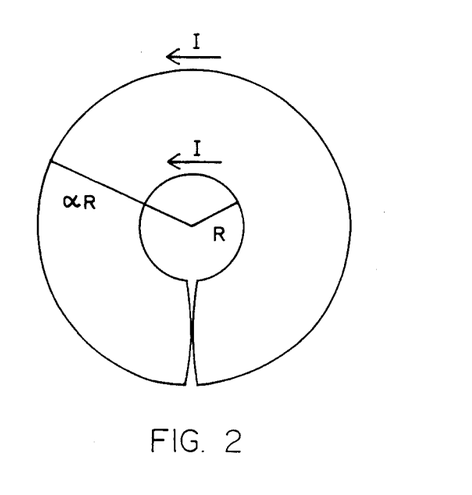
FIG. 2 is a schematic representation of a double loop variable magnetic bottle used in the present invention.

The bottle field is typically produced by a loop of ferromagnetic material in the x-y plane of the Penning trap, at the center of the z axis, and is constant in time. Variable bottles, also feasible, are a central component of the experiment described below. FIG. 2 illustrates a successful implementation of a variable bottle made from a single continuous superconducting NbTi loop twisted into two concentric loops. The double loop is inserted into the homogeneous magnetic field above its critical temperature. As it cools to the superconducting state, it freezes the enclosed flux in. Application of the field from a third magnet (an external solenoid of variable current) leads the now superconducting double loop to resist the new flux via Lenz's law, producing a persistent current. It is this current that adds a bottle field. A single loop would have the same effect, but the double loop has an added advantage. There exists an optimum ratio, $\alpha$, of the outer loop radius to the inner loop radius for which the only contribution to the field is the magnetic bottle itself. No other terms are added to the magnetic field, most importantly no zeroth-order term; in fact, a double loop with ratio $\alpha$ improves the uniformity of the homogeneous field at the center of the trap. Thus, the double loop can serve as a shim to cancel out precisely any stray magnetic bottle-like inhomogeneities due to the trap itself (by creating a bottle field of opposite sign) and increase the uniformity of the remaining field. In the experiment described below, the main attraction of the double loop is its variability and its capacity to produce large bottle fields, at least on the order of 100 to 1000 G/cm$^2$.

Variable magnetic field gradients which approximate the form of Equation (30) over the ion orbit can also be made in a more conventional way with loops driven directly by a current source, rather than inductively. Indeed, electromagnets with this geometry are a part of the standard set of magnetic field shims for high resolution NMR and such an approach is practical here as well. Another possibility is to use superconducting loops which are repeatedly energized and quenched to give the necessary rise and fall in $\Delta B$.

V. Axial motion in strong magnetic bottles: numerical simulations

Simulations of ion trajectories in Penning traps with strong magnetic bottles show frequency shifts which agree with the quantum perturbation predictions of Equations (46). The results depart from quantitative agreement with these predictions as the bottle fields increase beyond the limit of perturbation theory, but still agree qualitatively. The axial transform continues to consist of a single frequency (to better than 1%) in strong bottles ($B_2 \approx 1000$ G/cm$^2$ in Penning traps with $B_0 \approx 1$ to 5 T). This is understood qualitatively if the axial motion is assumed to remain strongly decoupled from the cyclotron and magnetron modes (a point that will be important in the experiment proposed below). The simulation program also reveals previously unreported behavior in the strong bottle limit: the cyclotron motion is modulated at twice the axial frequency. Small motional sidebands of the $\omega_+$ centerband, with intensity up to $\approx 10\%$ that of the centerband, appear at $\omega_+ \pm 2\omega_z$ in the Fourier transforms of the transverse coordinates (both $\omega_+$ and $\omega_z$ are shifted by the bottle). These are easy to understand qualitatively as frequency modulation (FM) sidebands. A stable axial oscillation at frequency $\omega_z$ varies the $z^2$ term in the z component of the bottle field (Equation 31) at a frequency of $2\omega_z$. Since $\omega_+ >> \omega_z$, a given cyclotron orbit averages out the transverse components of the bottle, but keeps the axial component: hence the modulation of the cyclotron frequency at twice the axial frequency. This FM model, however, grossly overestimates the sideband intensities, emphasizing the need for the quantitative trajectory simulation. The small size of the axial frequency sidebands and the absence of the other modulation facilitates the development of the theory presented below.

VI. Spin dependent axial potentials

Examination of equations of motion (37) in light of the decoupled axial motion observed in numerical simulations suggests a helpful simplification which will be used to derive analytical solutions for the effect of magnetic resonance on the axial motion. The only dependence of the trial equation of motion on the transverse coordinates comes in through the term with $$x \frac{dy}{dt} - y \frac{dx}{dt},$$

and through $|B|$. In the presence of a bottle, no modulation of the axial motion by the transverse modes is observed in simulations. This suggests that the dominant effect of these terms is due to their average value. The first approximation made is thus, $$x \frac{dy}{dt} - y \frac{dx}{dt} = C, \quad [49]$$

with C a constant. Note that, in the limit of no magnetron motion, C reduces to $\omega_+ \rho^2$, the z component of the mechanical angular momentum (divided by the mass). The magnetic bottle shifts the axial frequency by $$\Delta\omega_z = \frac{qB_2 C}{2m\omega_z}.$$

This shift is equal (to first order in $B_2$) to that predicted quantum mechanically (Equation 46b). Furthermore, in the limit where $|\Delta B| << B_0$ over all points sampled by the ion trajectory (which occurs for typical orbit sizes, even for relatively large $B_2$), the magnetic field is approximately $$|B| \approx B_0. \quad [50]$$

Under these conditions, the axial equation of motion becomes $$\frac{d^2z}{dt^2} + \left(\omega_z^2 + \frac{qB_2C}{m} - \frac{2\mu}{m}B_2\right)z - \frac{2\mu}{mB_0}B_2^2 z^3 = 0. \quad [51]$$

Since the case under consideration is a spin $\frac{1}{2}$ ion, $\mu = \pm|\mu_B|$ for $m_s = \pm\frac{1}{2}$. Equation (51) is now split into an explicitly spin dependent equation, $$\frac{d^2z}{dt^2} + \left(\omega_z^2 + \frac{qB_2C}{m} \mp \frac{2|\mu_B|}{m}B_2\right)z \mp \quad [52]$$

$$\frac{2|\mu_B|}{mB_0}B_2^2 z^3 = 0 \text{ for } m_s = \pm\frac{1}{2}.$$

This differential equation may be solved by the energy method. Straightforward integration of the equation with respect to the axial coordinate gives the potential energy per unit mass. Defining spin up and spin down potentials as $U_+$ and $U_-$, respectively, the potential per unit mass is $$\frac{1}{m} U_\pm = \quad [53]$$

$$\int \left[\left(\omega_z^2 + \frac{qB_2C}{m} \mp \frac{2|\mu_B|}{m}B_2\right)z \mp \frac{2|\mu_B|}{mB_0}B_2^2 z^3\right]dz.$$

Performing the integration, and substituting in Equation (8) for $\omega_z^2$, $$U_\pm = \left(\frac{qV_o}{2d^2} + qB_2C \mp |\mu_B|B_2\right)z^2 \mp \frac{|\mu_b|B_2^2}{2B_0}z^4 \pm \frac{\hbar\omega_{L0}}{2}, \quad [54]$$

where the constants of integration $\pm n\omega_{L0}/2$ are the $z=0$ energies of each curve. At $z=0$, the only potential energy contribution arises from the Zeeman splitting of the electron spin levels in the homogeneous magnetic field $B_0z$; thus, $$U_+(z=0) - U_-(z=0) = n\omega_{L0}. \quad [55]$$

Note that these potentials are independent of mass, and $U_+ > U_-$ up to a crossing point, since $U_-$ is steeper than $U_+$ over this region. Assuming that $B_0 > 0$, the two potential curves cross at $\pm 0.8556$ $$\sqrt{\frac{B_0}{B_2}}$$

for $B_2 > 0$, and $\pm 1.653$ $$\sqrt{\frac{B_0}{|B_2|}}$$

for $B_2>0$. The smaller of these (for $B_2>0$), with $B_0=1$ T and $B_2=1000$ T/m², is 2.71 cm, much larger than typical orbit dimensions, so the crossing points play no role here. The difference in axial frequencies due to the different curvatures is negligible; this can be expected, considering the negligible weight of the spin-dependent term in the quantum perturbation estimate for the axial frequency shift (Equation 46b).

The difference in curvature of the two potentials implies that a given amount of axial energy will translate into a larger axial amplitude in the shallower (spin up) curve. Following the usual notation, $|\alpha>$ stands for the spin up $(m_s=\frac{1}{2})$ state, and $|\beta>$ stands for the spin down $(m_s=-\frac{1}{2})$ state. Then, $|\alpha>\longleftrightarrow|\beta>$ transitions should cause a change in the axial amplitude of a trapped ion. Consider transitions due to $\pi$ pulses precisely at $z=0$ to maximize the effect, when all of the axial trapping energy is "stored" as kinetic energy. The ion carries this kinetic energy with it when the $\pi$ pulse moves it from one potential to the other. Moving between these potentials of different curvature changes the classical turning points, i.e., the amplitude of the axial motion. Defining $z_+$ as the axial amplitude in state $|\alpha>$, and $z_-$ as that in state $|\beta>$, the axial amplitude change for a transition is obtained by solving the equation (Equation 56)

$$U_+(z=z_+) = U_-(z=z_-) + n\omega_{L0}. \quad [56]$$

VII. Axially synchronized spin flipping cycles

The existence of spin dependent axial potentials allows the development of a novel magnetic resonance spectroscopy of ions. For a given amount of axial energy, the amplitude of the axial oscillation contains information on the spin state of an ion. It will be shown that spin flips synchronized with the axial oscillation of an ion change the axial amplitude and thus serve as a test of the original spin state. The sign of the change depends on the original spin state, analogous to the situation in a Stern-Gerlach experiment. The magnitude of the change can be magnified by using multiple flips. Even so, the change in axial amplitude will usually be small and impractical to detect by direct observation of the axial motion. However, because of the coupling of the cyclotron motion to the axial motion mediated by a strong magnetic bottle, the amplitude change can be detected as a shift in the cyclotron frequency. Examination of Equation (46a) shows that an increase in axial amplitude (i.e., an increase in the axial quantum number k) should produce an increase in the cyclotron frequency for a positively charged ion.

The mechanism proposed uses the difference in the curvatures of $U_+$ and $U_-$ as an energy pump or drain, depending on the initial spin state. Spin flips take place via $\pi$ pulses at two different frequencies, corresponding to the resonances connecting the potentials at $z\approx 0$ and $z\approx z_1$. Since feasible $\pi$ pulse times for electrons are as low as $\approx 10$ nsec, the pulses are considered instantaneous on the axial timescale. At $z=0$, the resonance frequency is just the Larmor frequency $\omega_{L0}$. At $z=\pm z$, however, the frequency $\omega_{L1}$ is given by $$\omega_{Li} = \frac{1}{h}(U_+(z=z1) - U_-(z=z1)) = \quad [57]$$

$$\omega_{L0} - \frac{2|\mu_B|B_2}{h}z_1^2 - \frac{|\mu_B|B_2^2}{hB_0}z_1^4.$$

It is assumed initially, for simplicity, that the axial motion has been previously excited by a voltage pulse to the trapping electrodes to a reasonably large initial amplitude, $z_A$ (0.05 to 0.5 cm), so that the distribution of axial velocities is small compared to the mean axial velocity. Thus there will be a definite phase of the axial motion to which the magnetic resonance pulse will be synchronized. The $\omega_{L1}$ spin flipping positions $\pm z_1$ are chosen as large as possible, but smaller than $z_A$ by several multiples of the width of the initial (thermal) distribution in z to ensure that for nearly all ions the axial amplitude is still greater than $z_1$ after a given spin flip.

Figure 3A:
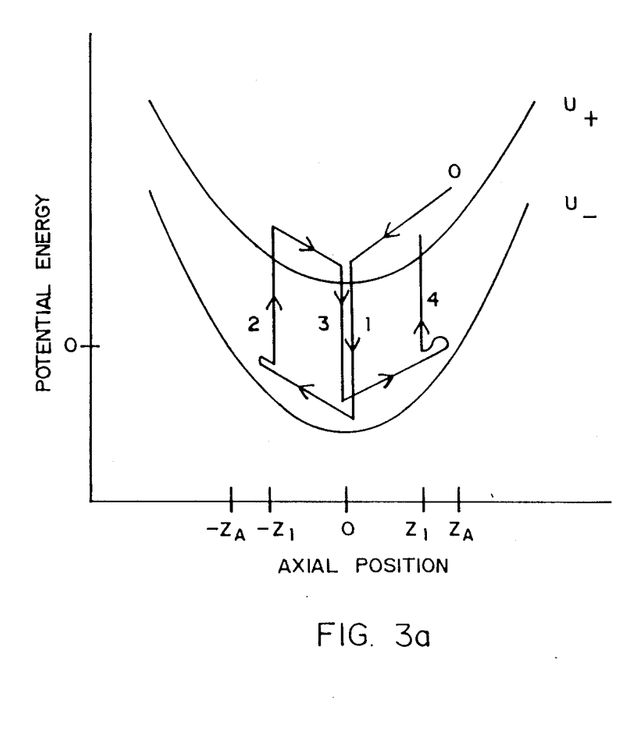
FIGS. 3a and 3b, is a graphical illustration of the effects of one axial cycle with synchronized spin flips for initial upward spin and initial downward spin, respectively.
Figure 3B:
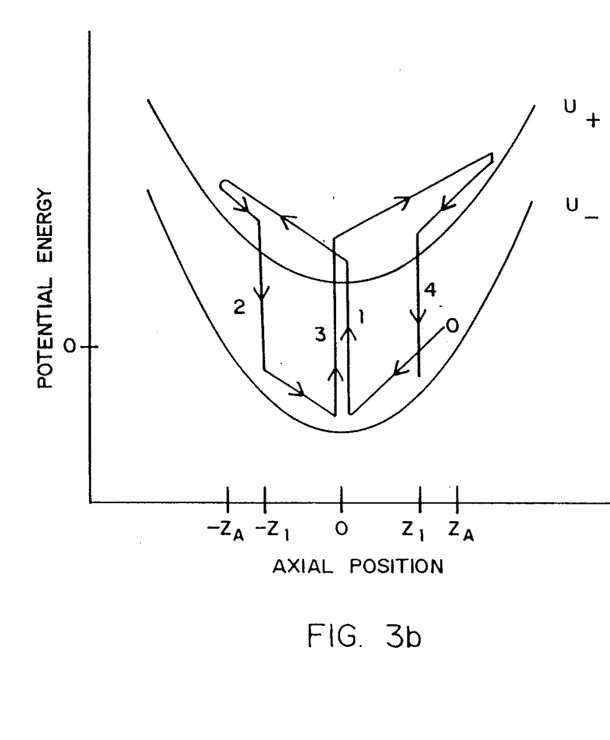

To distinguish between the two possible initial spin states, the spin flip sequence is chosen so that it will decrease the axial energy if the initial state is $|\alpha>$, and increase the axial energy if the initial state is $|\beta>$. A total of four $\pi$ pulses are given in each axial period as shown in FIGS. 3. The ion is assumed to be at $z\approx z_A$ at time zero, and moving toward the origin. Consider first the case where the initial spin state is $|\alpha>$, as in FIG. 3a. The ion experiences a $\pi$ pulse (frequency $\omega_{L0}$) as it passes through the origin, and moves to the $U_-$ potential, losing energy $n\omega_{L0}$ in the process (step 1 in FIG. 3a). Having gone from a shallower curve to a steeper curve, the ion turns at some point closer to the origin than $-z_A$, and then undergoes a spin flip ($\pi$ pulse of frequency $\omega_{L1}$) as it moves through $-z_1$, gaining energy $n\omega_{L1}$ from the transition (step 2 in FIG. 3a). It is this step that sets an upper bound for $z_1$, since the turning point of the ion while in the $U_-$ potential must always be farther from the origin than $\pm z_1$. Steps 3 and 4 of FIG. 3a are similar to steps 1 and 2, respectively. At the end of one axial period, the ion has lost an amount of energy equal to $2n(\omega_{L0}-\omega_{L1})$. If this is repeated over N such cycles, the axial amplitude decreases to a value $z_N$ such that $$U_+(z_N) = U_+(z_A) - N\,2n(\omega_{L0}-\omega_{L1}). \quad [58]$$

The explicit solution of this equation is $$z_N = \sqrt{\frac{B_0}{|\mu_B|B_2^2}\left\{\frac{qV_0}{2d^2} + qB_2C - |\mu_B|B_2 - \left[\left(\frac{qV_0}{2d^2} + qB_2C - |\mu_B|B_2\right)^2 - \frac{2|\mu_B|B_2^2}{B_0}\left(\left(\frac{qV_0}{2d^2} + qB_2C - |\mu_B|B_2\right)z_A^2 - \frac{|\mu_B|B_2^2}{2B_0}z_A^4 - 2hN(\omega_{L0}-\omega_{L1})\right)\right]^{\frac{1}{2}}\right\}^{\frac{1}{2}}}. \quad [59]$$

The energy gaining case, where the initial spin state is $|\beta>$, is analogous to the situation just described. The ion starts at $z\approx z_A$ at time zero in the spin down potential. As it moves through the origin, a $\pi$ pulse of frequency $\omega_{L0}$ sends the ion to the spin up potential, with energy gain $n\omega_{L0}$ (step 1 in FIG. 3b).

The ion turns at a point beyond $-z_A$, since it has gone from a deeper to a shallower curve, then returns toward the origin. A $\pi$ pulse of frequency $\omega_{L1}$ flips the spin as the ion moves through $-z_1$, with energy loss $n\omega_{L1}$ (step 2 in FIG. 3b). Steps 3 and 4 of FIG. 3b are analogous to steps 1 and 2, respectively. In contrast to the preceding case, the ion has gained a total amount of energy equal to $2n(\omega_{L0}-\omega_{L1})$ after one axial period. If N such cycles are performed, the axial amplitude increases to a value $z_N$ such that $$U_-(z_N) = U_-(z_A) + N\, 2n(\omega_{L0}-\omega_{L1}). \qquad [60]$$

The solution of Equation (60) is $$z_N = \sqrt{\frac{B_0}{|\mu_B|B_2{}^2}} \left\{ -\frac{qV_0}{2d^2} - qB_2C - |\mu_B|B_2 + \left[\left(\frac{qV_0}{2d^2} + qB_2C + |\mu_B|B_2\right)^2 + \frac{2|\mu_B|B_2{}^2}{B_0}\left(\left(\frac{qV_0}{2d^2} + qB_2C + |\mu_B|B_2\right)z_A{}^2 + \frac{|\mu_B|B_2{}^2}{2B_0}z_A{}^4 + 2hN(\omega_{L0}-\omega_{L1})\right)\right]^{\frac{1}{2}} \right\}^{\frac{1}{2}}. \qquad [61]$$

The axial amplitude changes predicted here are substantiated by exact numerical simulations of the full classical motion. A numerical simulation designed to flip the spin instantaneously at $z=0$ and $z=\pm z_1$ at the times indicated above and in FIG. 3 shows axial amplitude changes that match Equations (59) and (61). This agreement increases confidence in the approximations made in Equations (49) and (50). The axial motion can indeed be considered decoupled from the transverse motions. The simple physical picture of two axial potentials differing only because of the spin state of the ion is valid.

As stated previously, these changes in axial amplitude will be monitored via shifts in the cyclotron frequency. This can be understood qualitatively by supposing that the cyclotron frequency is proportional to the average magnetic field experienced over an axial period. Greater axial amplitude carries the ion into the region where the magnetic bottle contribution $B_2z^2$ is more important. More precisely, the spin-dependent shifts due to the magnetic bottle will be shifted further by the spin-dependent change in the axial quantum number k. Squaring the quantum operator for z (Equation 17) and taking its expectation value in a pure state $|n\, k\, 1\, s\rangle$, a quantum analogue of the square of the axial amplitude is obtained. Rearranging this and solving for k gives $$k = \frac{m\omega_z \langle z^2\rangle}{2h} - \frac{1}{2}. \qquad [62]$$

Assuming that the quantum numbers n and l remain constant, the observed shift after a spin flipping experiment is $$\delta = \Delta(\Delta\omega_+) = \Delta\omega_+[k(z_N)] - \Delta\omega_+[k(z_A)]. \qquad [63]$$

Examining Equation (46a), and assuming $qB_2>0$, it is determined that $\Delta\omega_+$ increases with increasing k. Thus, the energy gaining experiment, where the initial state is $|\beta\rangle$, produces a positive frequency shift, while the energy losing case, with initial state $|\alpha\rangle$, leads to a negative shift.

Combining Equations (12), (46a), and (62), $$\delta_\pm = \frac{qB_2}{m}(z_N{}^2 - z_A{}^2) \text{ for initial spin } m_s = \pm\frac{1}{2}. \qquad [64]$$

The 1/m dependence, which comes from the usual sensitivity of cyclotron frequency to mass, means that heavier ions require a greater number of spin flip cycles to separate spin states by a given cyclotron frequency difference. For a fixed trap size (d), the trapping voltage ($V_0$) may be adjusted for heavy ions to compensate for the mass effect. Although it is not obvious from a cursory glance at Equations (59) and (61), the axial amplitude change depends as $$\frac{1}{\sqrt{V_0}},$$

as is the case in the absence of the magnetic bottle; this is verified by numerical solution of the exact equations over a broad range of values. This dependence arises because, as $V_0$ increases, $N\, 2n(\omega_{L0}-\omega_{L1})$ becomes less significant. Expressing $\delta$ in terms of the fundamental experimental parameters, $$\delta_\pm = \mp\frac{2NB_2d^2h(\omega_{L0}-\omega_{L1})}{mV_0} \text{ for initial spin } m_s = \pm\frac{1}{2}; \qquad [65a]$$

$$\delta_\pm = \mp\frac{2Nd^2|\mu_B|}{mV_0}\left[2B_2{}^2z_1{}^2 + \frac{B_2{}^3}{B_0}z_1{}^4\right]. \qquad [65b]$$

This suggests that, with a limited frequency resolution in the detection mechanism, the applicability of the spin flipping technique may be extended to larger ions by lowering the trapping potential instead of resorting to very long trains of $\pi$ pulses. Estimating the practical limit of this process will require a thorough exploration of ion cooling and trapping with low potentials. In the following, values of $V_0$ near those of known trapping experiments will be assumed.

VIII. Calculated shifts for typical experiments

The inverse mass dependence of the axially synchronized spin flip effect (Equation 64) makes the choice of a small ion appropriate for the first experiments. The smallest molecular ion, $H_2{}^+$, has an unpaired electron and is therefore a good test ion. Typical numbers for the detection of its electronic spin state via ICR follow. However, with future experiments in mind, numbers are also presented for a spin ½ ion of 100 amu mass. The Penning trap considered has a characteristic dimension of 1 cm, with $B_0=1$ T, and a strong magnetic bottle, with $B_2=1000$ G/cm². The cyclotron radius and the axial amplitude are both assumed excited to 0.5 cm. Under these conditions, the cyclotron frequency (in the absence of the bottle) of $H_2{}^+$ is approximately 7.6 MHz, and that of the 100 amu ion is 150 kHz.

With a trapping voltage of 10 V, 4 spin flip cycles give a cyclotron shift of ±1.14 Hz; thus, spin-up and spin-down are separated by 2 Hz. The voltage dependence expressed in Equations (65) may be put to experimental advantage by reducing $V_0$ to 5 V, giving the same shift with only 2 cycles (8 $\pi$ pulses). At a trapping voltage 10 V, the 100 amu ion requires 175 cycles to give a ±1 Hz shift. Reducing $V_0$ to 1 V decreases the number of cycles to 18.

IX. Experimental sequence for detecting magnetic resonance by ICR

The shifts in cyclotron frequency predicted above would be readily observed in ordinary ICR with no magnetic bottle. However, in the presence of the bottle, the distribution of thermal energies would give rise to distributions of cyclotron frequencies which would obscure the spin effects. This can be seen by substituting into Equation (46a) values of the quantum numbers n, k, and l typical of ion ensembles at ambient temperatures. At 300 K. this effect gives an inhomogeneous distribution of the cyclotron frequency equal to 15% of its center value. The small shifts $\delta_\pm$ must be measured despite this distribution. This can be achieved via measurements of the cyclotron frequency taken before and after a magnetic resonance evolution period in the absence of the bottle field. Suppose the cyclotron frequency of an ion is measured just before applying N spin-flipping axial cycles; let the initial measured frequency be $\omega_+$ (t=0). Let the time after the N cycles be $t_N$. Then, $\omega_+$ (t=$t_N$) is $\omega_+$ (t=0)+$\delta_\pm$ for $m_s=\pm\frac{1}{2}$. After the application of another set of N cycles, ending at time $t_{2N}$, $\omega_+$ (t=$t_{2N}$) is $\omega_+$ (t=0)+2 $\delta_\pm$ for $m_s=\pm\frac{1}{2}$. However, if some event cause a spin flip between the first and the second set of N cycles, $\omega_+$ (t=$t_{2N}$) would be $\omega_+$ (t=0) for both spins. In the following, it is assumed that the only significant mechanism of spin flips in the period between the $\pi$ trains is Larmor frequency irradiation. Spin-lattice relaxation is neglected as seems reasonable for small molecules under collisionless conditions.

MR information is encoded by providing a variable mechanism for spin reorientation between the two sets of N spin flipping axial cycles. After the first set of N cycles, the bottle field is turned off (to make the magnetic resonance spectrum independent of the translational quantum numbers), and a $\pi/2$ pulse is applied, followed by another one at a variable time $t_1$ later. The bottle is then turned on again, the second set of N cycles is applied in synchrony with the axial motion, and the cyclotron frequency is measured. As $t_1$ is varied from one run to the next, the probability of finding the ion in one spin state or the other oscillates and MR is observed via the cyclotron shifts. Specifically, each ion exhibits one of three outcomes: a shift by 2 $\delta_+$, a shift by 2 $\delta_-$, or no shift. If $\Delta\omega$ is the resonance offset, the probability of the first two outcomes is $\frac{1}{4}$ [1+cos ($\Delta\omega$ $t_1$)] each, and that of the third is $\frac{1}{2}$ [1−cos ($\Delta\omega$ $t_1$)]. The signal $S(t_1)$ consists of one bit (a zero or a one) placed in each of these three "channels". To obtain an accuracy of at least M bits in each channel, the single-ion experiment must be repeated 4M times for each value of $t_1$. The number of bits needed and the number of points in $t_1$ will depend on the complexity of the spectrum $S(\omega_1)$, the Fourier transform of $S(t_1)$. For example, if as is usually the case in ESR, the electron experiences hyperfine coupling to nuclear spins in the ion, then there will be multiple resonance frequencies $\Delta\omega$. Spin rotation coupling will introduce additional structure.

If the experiment is performed on a single ion, the same ion may be used again as $t_1$ is varied, or a new ion of the same species may be trapped. Because of the probabilistic nature of the spin state transitions, however, it will save time to perform this experiment on small clouds of ions. Since the distribution of cyclotron frequencies $\omega_+$ (t=0) is orders of magnitude greater than the shifts $\delta_\pm$, there is negligible probability of the signal from two ions falling in overlapping ranges. Thus the limit on the number of ions will likely be determined by ion-ion interactions, a subject of future study.

Figure 4:
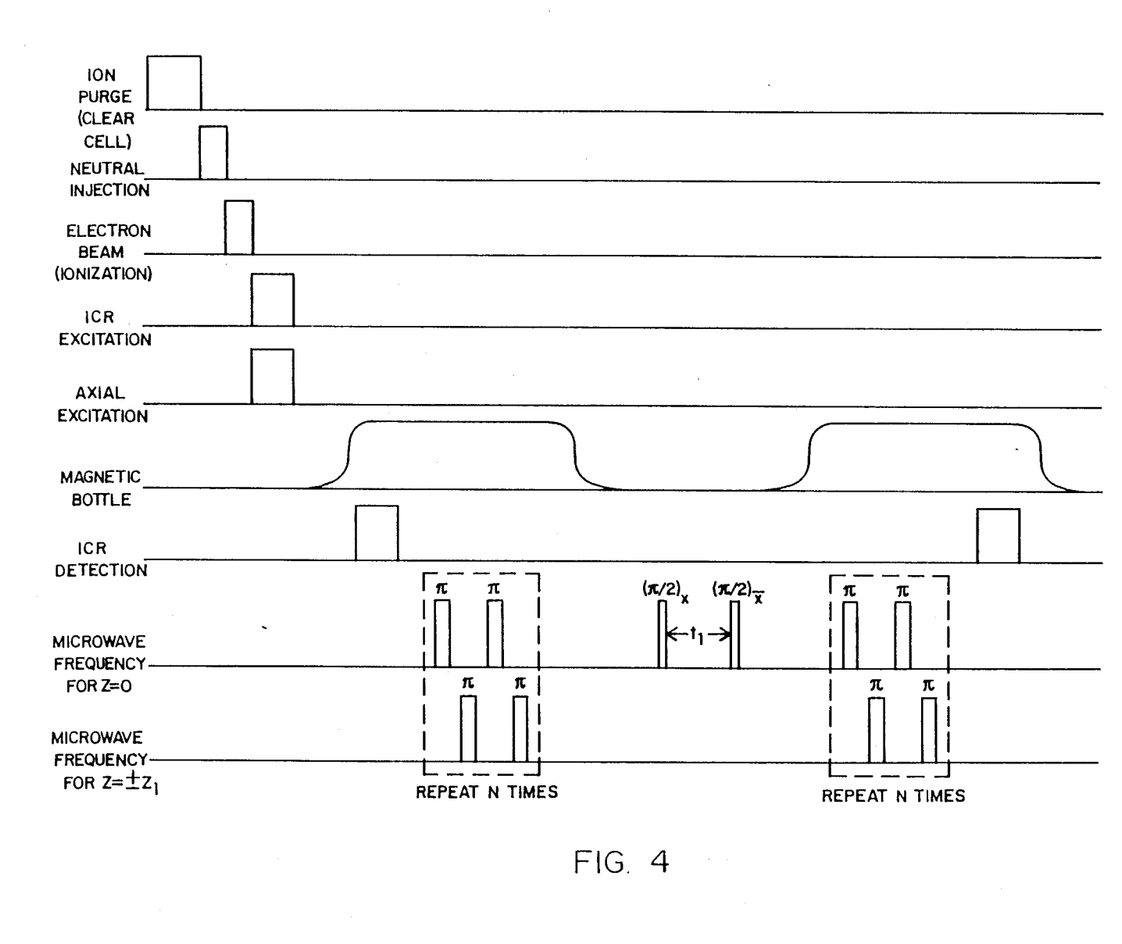
FIG. 4 is a master timing diagram for performing magnetic resonance spectroscopy by means of ion cyclotron resonance in accordance with the present invention.

A schematic timing diagram for the experiment is presented in FIG. 4. It includes an initial period of axial and ICR excitation; this is advantageous, since larger axial and cyclotron amplitudes increase both the strength of the signal observed, and the effects of the magnetic bottle. It may also be necessary to repeat the ICR excitation pulse before every run, since the cyclotron frequency detection circuit will damp the cyclotron motion considerably, as is discussed below.

It should be noted that neither the ICR excitation nor the axial excitation is strictly necessary to the method. This is because the detection is of single ions; it does not rely on their moving coherently as is true for the cyclotron motion in ordinary ICR. Here the ICR excitation is simply a convenient way of obtaining easily detectable orbits; the equilibrium orbit size at ambient temperatures would give much smaller signal amplitudes. Sufficiently large axial motions could be obtained simply by lowering the trapping voltage $V_0$, but if this were done then the phase of the axial motion would need to be measured for synchronization with the $\pi$ train or an average over a random phase would need to be taken into account with an accompanying reduction in the fraction of ions that experience detectable frequency shifts.

The description so far is a time-domain implementation of the invention. Just as in ordinary ESR, there is also a frequency domain analog. The steps consisting of two $\pi/2$ pules separated by a period $t_1$ could be replaced by continuous irradiation for a fixed period at a frequency $\omega_1$. Variation of this frequency from step to step would replace variation of $t_1$ and in the limit of low power would give a spectrum $S(\omega_1)$ directly. This experiment would generally be more time consuming, but would require lower microwave power than $\pi/2$ pulses short enough to excite the spectral width. Similarly, the train of short $\pi$ pulses could be replaced by a train of adiabatic rapid passages through the spectrum with low power, which would serve the same purpose of inverting spins in synchrony with the axial motion.

X. Experimental considerations

A. Ion traps as microwave cavities

The method described requires that the ion trap also serve as a microwave cavity at the two frequencies $\omega_{L0}$ and $\omega_{L1}$. The analysis has assumed for simplicity $\pi$ and $\pi/2$ pulses much shorter (e.g., 10 ns) than typical axial periods (>1 $\mu$s). This is easily obtained with standard pulsed ESR technology if the ion trap has the cavity properties typical of ESR cells. This is known to be the case. The microwave modes of both Penning and cylindrical ion traps have been examined in detail by Brown, Gabrielse, Tan and Chan. The mode patterns and mode Q factors of 100–1000 are typical of pulsed ESR cavities, so there is no incompatibility between the ICR requirements and the ESR requirements. With cavity dimensions of $\approx 1$ cm, the lowest frequency modes will be $\approx 30$ GHz and mode spacings of the order of several hundred MHz (as assumed for $\omega_{L0}-\omega_{L1}$ in the numerical examples) are common. More precise characterization of the modes requires experimental measurement on a particular cavity. The uncertainty in the exact mode positions is not a problem operationally; since the exact values of $B_0$ and $B_2$ are free parameters, they may be adjusted so that the necessary ESR transitions coincide with existing cavity modes. Continuously tunable microwave sources with adequate power are available up to at least 40 GHz, so this is not a constraint.

Similarly, the exact spatial pattern of the modes used is not critical, because the spin flips can be made to occur in a region of space small compared to the spatial variation of the fields. The microwave power or the pulse length is simply adjusted in the usual way to achieve the desired pulse angle for a particular point in the ion orbit. The $\pi$ and $\pi/2$ pulses could be given at intervals that are multiples of the cyclotron frequency so that the same azimuth position in the cell is used for successive pulses. For modes with azimuthal index equal to zero, this extra synchronization is unnecessary.

B. Detection

Figure 5A:
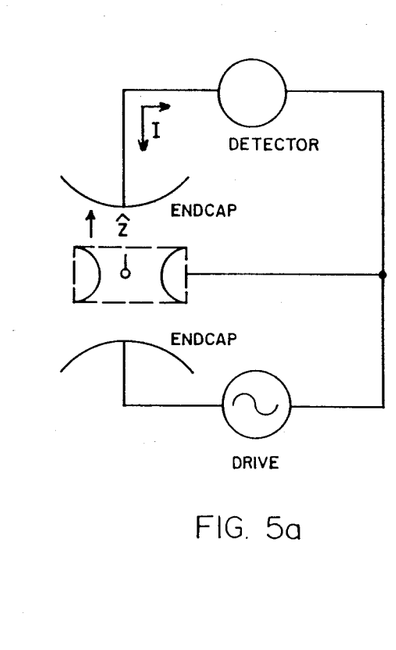
FIGS. 5a and 5b, illustrates detection circuits for the axial and cyclotron motions, respectively.
Figure 5B:
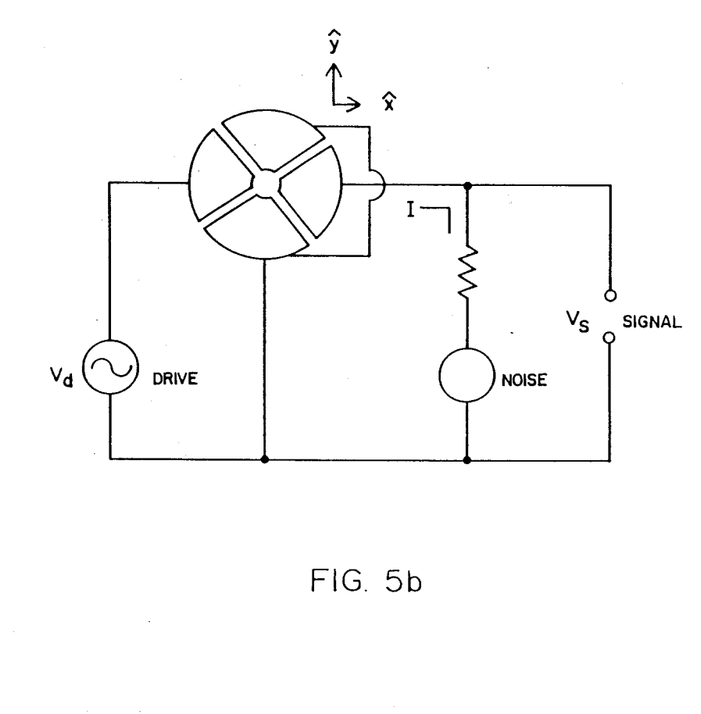

Detection circuits for the axial and cyclotron motions are shown in FIG. 5. The circuits are entirely analogous, since both detect the image currents produced on opposing plates by the motion of charge in the trap. The axial circuit (FIG. 5a) uses the trap endcaps for driving and detecting the axial motion, while the cyclotron circuit (FIG. 5b) uses two adjacent or opposing quadrants of the slit cylindrical ring. It is also possible to detect a combination of the cyclotron and magnetron frequencies as a voltage between the endcap and the central ring, which need not then be split. For convenience these will all be referred to as ICR detection. The drive frequency in each case may also be used for phase sensitive detection. The resistor damps the motion by removing energy from the observed oscillation.

As discussed previously, axial detection is not strictly necessary; it is mentioned only because of the potential value of axial cooling for preventing detrapping at low $V_0$. It can also be used to measure the axial frequency and phase to avoid having to vary the $\pi$ train timing to locate these values. No axial detection, and hence negligible axial damping, takes place during the ICR portion of the experiment. This is not the case for the cyclotron motion, since the cyclotron frequency must be measured at the beginning and end of the experiment. Since small cyclotron frequency shifts due to the axially synchronized spin flip experiment will be measured, any other mechanism which also shifts the frequency must be understood. Detection damps the motion, decreasing the cyclotron radius. With the magnetic bottle field present during detection, damping translates into a constantly shifting cyclotron frequency. Recalling Equation (48), and assuming that $qB_2 > 0$, a uniform decrease in the cyclotron radius leads to a uniform time-dependent increase (chirp) in the magnetic bottle shift of the cyclotron frequency. If this increase can be predicted accurately, its effect may be removed from the problem by a variety of methods (sweeping a reference frequency at the same rate, manipulating the Fourier transformation mathematically, etc.) which demodulate the chirp. This is very much like some problems encountered in radar observation.

The damping constant $\gamma_+$ defines the rate at which the cyclotron energy decays:

$$E_n(t) = E_n(t=0)e^{-\gamma_+ t}; \quad [66]$$

$$\gamma_+ = \left(\frac{qk'}{2\sqrt{2}\,d}\right)^2 \frac{R}{m} \frac{\omega_+}{\omega_+ - \omega_-}, \quad [67]$$

where R is the resistance in ohms and k' is a constant of order unity, exactly equal to one for perfect flat endcaps. Since the cyclotron energy is proportional to the square of the cyclotron radius, and since the magnitude of the shift in $\omega_+$ due to the bottle field is also proportional to the square of the cyclotron radius (Equation 48), the magnitude of the shift also decays with time constant $\gamma_+$. The cyclotron motion during detection has a time dependent frequency. The small frequency shifts $\delta_\pm$ produced by the MR/ICR experiment can be calculated, since the peaks in the demodulated ICR Fourier transforms are just the frequency at the end of the pre-experiment detection period and the frequency at the beginning of the post-experiment detection period. For example, for the $H_2^+$ experimental values given above, the total cyclotron frequency shift due to damping during one second of detection is around 150 Hz, a very small fraction of the detection bandwidth.

The method described assumes the detectability of single ions in orbits of $\approx 0.5$ cm radius. Routine ICR instruments typically have a detection sensitivity of $\approx 100$ ions. Single ion detection is however feasible in the present method with existing technology. Signal amplitude is proportional to cyclotron radius and the radius proposed is an order of magnitude greater than that used for high resolution mass-spectroscopy by FT/ICR. In that experiment, resolution is limited by inhomogeneous broadening due to small uncontrolled inhomogeneities ($\approx$ ppm) of the magnetic field causing ions in different orbits to have slightly different, but unresolved, frequencies. Since this broadening becomes more severe at larger radius, the radius is intentionally kept small to retain the resolution needed for mass discrimination. Thus, signal amplitude is less than linear in both the number of ions and their average radius. In the present invention, this issue of inhomogeneous broadening is made irrelevant by the intentional introduction of the large magnetic bottle. As discussed, it is large enough so that if multiple ions are present they will have resolved frequencies and the amplitude of each will grow linearly with its radius. The amplitude of the dechirped signals will also grow linearly with the length of the ICR detection periods, so long as these are short compared to the characteristic time for broadening due to collisions of the ion with neutrals. Vacuum requirements are discussed in the following section.

These considerations only indicate that the goal of single-ion detection is not as difficult as might be guessed by extrapolation from routine ICR practice. It remains to show quantitatively that sensitivity is adequate by comparing signal-to-noise. The rms signal current can be calculated according to Comisarow as $$I_s(rms) = \frac{q^2 r |B|}{\sqrt{2}\,ma} \quad [68]$$

where a is the distance between opposing electrodes. With typical parameters (m=100 amu, r=0.5 cm, a=2 cm, $B_0 = 1$ T) a signal of $2.7 \times 10^{-14}$ A is found. If this is detected for at least several hundred ms, then the signal power is confined to a frequency range of less than 1 Hz. The noise power in this interval with the preamplifier described by Jefferts and Walls is $2.5 \times 10^{-16}$ A. Thus signal-to-noise ratios better than 100 are obtainable for room temperature operation. Further improvement, which could be useful for higher masses, could be obtained by operating the cell and preamplifier at low temperature.

C. Vacuum and temperature requirements

Collisionless conditions have been assumed throughout. This allows the treatment of spin as a conserved quantity. Collisional phenomena are understood well in ICR, and are separated into chemically reactive and nonreactive categories. In ICR, an ensemble of ions is observed after coherent excitation, and the signal is modeled in terms of an effective rotating electric monopole in the trap. Nonreactive collisions lead to dephasing of the individual orbits, a decrease in the radius of the monopole, and a loss of signal. Reactive collisions eliminate ions. Assuming that the collisions in the case proposed here are nonreactive, analysis of the reduced collision frequency for the Langevin potential (ion-induced dipole potential) gives room-temperature relaxation times of around 2 seconds for 100 amu ions of unity charge with pressure of $10^{-8}$ torr. This corresponds to linewidths (and reduced collision frequencies) on the order of the frequency shifts to be measured. Therefore, vacuum better than $10^{-8}$ torr will be necessary. This is readily achieved; commercial ICR spectrometers achieve $10^{-10}$ torr at ambient temperature.

D. Effects of strong microwave irradiation on ion motion

The motions of ions in time independent configurations like the Penning trap, or in slowly varying fields, are described by the guiding center approximation, in which the center of mass of the cyclotron orbit is a separable degree of freedom. Guiding center problems are defined by the relative invariance of the fields during each cyclotron cycle. In the Penning trap, for example, the motion then breaks up into the magnetron motion, which is the guiding center motion, with a fast cyclotron oscillation superimposed on this. Oscillating electric fields that satisfy the guiding center approximation (i.e., that vary slowly on the cyclotron time scale) cause drifts of the guiding center motion. During microwave pulses, however, an ion is subjected to fields that vary much faster than the cyclotron frequency; this is the domain of the oscillation center approximation. Oscillating electric fields now cause a drift of the oscillation center, not the guiding center. In a Penning trap, such fields would cause the cyclotron motion to drift, not the magnetron motion. Although a strong microwave burst will have magnetic and electric components, the electric part makes the only contribution to lowest order. The oscillation center drifts as if subject to an effective potential, the ponderomotive potential $\phi$, such that $$\phi = \left(\frac{q}{m\omega}\right)^2 <\frac{E_0^2}{2}>. \quad [69]$$

Some motional shifts may thus be expected and, hence, frequency shifts in a magnetic bottle. Simulations have shown these to be orders of magnitude smaller than the effect in question. This might be expected since the ion should not exchange energy with the field in the time average. Even if frequency shifts arise on the order of the shifts produced by the experiment, they are independent of spin and thus are distinguishable from the shifts due to magnetic resonance.

E. Rotational spectroscopy

As noted in the discussion of prior art, one of the effects which can be determined by an analysis of ESR at high resolution is spin-rotation couplings. A distinct possibility is that the invention could also be used to detect (purely) rotational transitions. In this case the transition moments driven by the microwaves would be between rotational states of the ion and may be electric-dipole allowed. If a pair of such levels has an energy separation which depends on magnetic field strength (Zeeman effect), then the analysis given here for spin carries over directly. The experimental approach requires no substantial modification; one needs only to vary $B_0$ and $B_2$ to match cavity modes to the neighborhood of the appropriate resonant frequencies. Since rotational spectroscopy of ions under collisionless conditions is impossible by straight microwave absorption techniques, such a method could augment the structural information available from magnetic resonance.

F. Implementation of the Method

Figure 6:
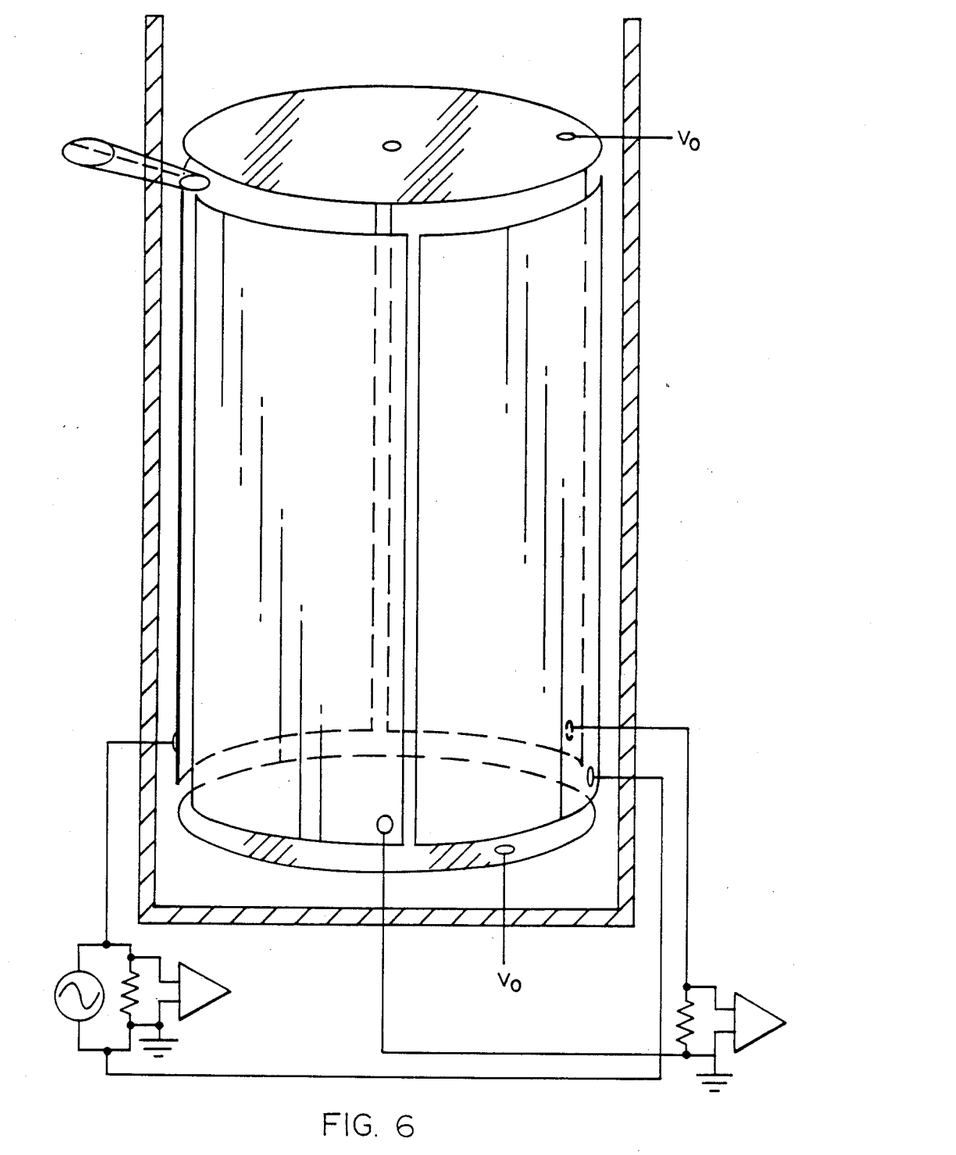
FIG. 6 is a schematic illustration of an apparatus in accordance with the present invention.

FIG. 6 illustrates an apparatus for carrying out the method of the present invention. Features depicted in FIG. 6 are: The electrodes of a cylindrical-type modification of a Penning trap consisting of endcaps at average potential $V_0$ at top and bottom and a center ring split into four quadrants at average potential zero. Opposite pairs of quadrants are connected to circuits for the excitation and/or detection of ICR. Microwaves for ESR irradiation are supplied by a waveguide at upper left. A hole indicated at the top allows introduction of ions or of neutrals and ionizing electrons. The trap is enclosed by a vacuum chamber and placed in variable homogeneous and spatially varying magnetic fields.

The presently preferred procedure for magnetic resonance via ion cyclotron resonance comprises the following steps:

1. Evacuating the trapping cell to a pressure of $10^{-9}$ to $10^{-10}$ torr.
2. Clearing the cell of any ions present by applying purging pulses to the cell endcaps: setting the electrostatic potential of the endcaps to a positive value, say 1–5 volts, to attract and purge all negative ions, then repeating with a negative potential to attract and purge all positive ions.
3. Introducing the ions to be studied into trap. This may be accomplished by introducing the parent neutral molecules, then ionizing with a beam of electrons along the trap axis of cylindrical symmetry.
4. Exciting the ions to a large cyclotron radius (e.g., 0.5 cm) by ICR excitation. Ions may also be excited to a large axial amplitude (again, 0.5 cm) by axial excitation.
5. Turning on the magnetic bottle field (e.g., 1000 tesla/meter$^2$).
6. Detecting the cyclotron motion of the ions via FT-ICR. Since signal will be chirped due to the presence of the magnetic bottle, this step includes the step of dechirping the signal to extract the final cyclotron frequency of ions.
7. Performing N axial spin flip cycles.
8. Turning off the magnetic bottle.
9. Applying a $(\pi/2)_x$ pulse to the electron spins.
10. Allowing the system to evolve over the time period $t_1$.
11. Applying a $(\pi/2)_x$ pulse to the electron spins.
12. Turning on the magnetic bottle.
13. Performing N axial spin flip cycles.
14. Detecting the cyclotron motion of the ions via FT-ICR. Dechirping the signal to extract the initial cyclotron frequency of ions. Comparing this spectrum to that detected in step #6 to correlate frequencies belonging to the same ions, and tabulate frequency shifts.

15. Turning off magnetic bottle.

16. Repeating steps 2–15 for different values of $t_1$. It may be possible to avoid repeating steps 2 and 3 every time if the ion trap has a long trapping time.

An illustrative apparatus for carrying out the foregoing method steps is shown schematically in FIG. 6.

G. Possible extensions

Since many "parent ions" of diamagnetic neutrals are paramagnetic, the techniques presented here could be applied to a large number of systems. In addition, this invention need not be confined to the study of electron spins. Though nuclear spins have gyromagnetic ratios three orders of magnitude smaller than that of the electron, adjustment of the various parameters of the invention could make the direct observation of nuclear resonances possible. The limits of low trapping voltages, large bottle fields, and high-resolution detection must be examined further to assess the possibility of NMR experiments. Since the amplitudes of hyperfine-split ESR lines reflect the populations of specific nuclear spin sublevels, NMR information is available in paramagnetic ions by electron-nuclear double resonance using only the electron magnetic moment for the coupling to the ion motion.

The method disclosed herein is not the only way to modify the orbits of ions for ICR detection of their internal spectroscopy. Generalizations can be made in several directions. The spin-dependent force could be applied in synchrony with ion motions other than the axial one. Similarly, motions other than the cyclotron motion may serve as the observable. Other static or oscillating magnetic or electric field gradients can replace the magnetic bottle in either of its roles of supplying a spin dependent potential and of making the detectable translational frequencies of the ions depend on their orbits. In particular, Enge and Bloom have shown that a spatial gradient in a transverse magnetic field at a frequency near resonance with an internal transitional of an ion exerts state-dependent forces analogous to those caused by the quasi-static bottle gradients here. They specifically calculate how these forces might be used for spin-dependent excitation of the cyclotron motion in an untrapped ion beam. In the context of the present invention, the same type of force could be modulated in synchrony with the trapped ion motions, replacing for example the synchronous $\pi$ train. These "transverse Stern-Gerlach" or "gradient dipole" forces act through the transition dipole and thus have the potential advantage of being applicable even in cases where there may be no difference in the electric or magnetic dipole moment of the two states to be connected spectroscopically. Another possible generalization is to rf ion traps, where the static magnetic field is not necessary because the ponderomotive potential due to intense rf irradiation is arranged so as to trap the ion.

Those having skill in the relevant art will now, as a result of the above disclosure, perceive various additions and modifications which may be made to the invention. Accordingly, it will be understood that all such additions and modifications are deemed to be within the scope of the invention which is to be limited only by the claims appended hereto.

We claim:

1. An apparatus for detection of magnetic resonance spectra; the apparatus comprising:
    a vacuum chamber;
    an ion trap including the trapping fields within said chamber for trapping at least one ion;
    means for exciting said ion for detection of its oscillating position;
    means for selectively introducing an electromagnetic field gradient within said chamber;
    means for detecting motion of the ion; and
    means for selectively coupling internal states of the ion to a near resonant radiation field in synchronism with its translational oscillation.

2. The apparatus recited in claim 1 wherein said ion trap is a Penning trap.

3. The apparatus recited in claim 1 wherein said ion exciting means comprises means for inducing a cyclotron radius large enough to detect single ions by the induced charges on nearby electrodes.

4. The apparatus recited in claim 1 wherein said ion exciting means comprises means for inducing an axial amplitude large enough to experience a range of fields which gives distinct motional frequencies to an ion before and after its state-dependent acceleration.

5. The apparatus recited in claim 1 wherein said electromagnetic field gradient introducing means comprises means for generating an electromagnetic field gradient sufficiently large to resolve the internal spectroscopic transitions at different points in the ion trajectory and another or the same such gradient sufficient to resolve the difference in translational frequency of an ion before and after state-dependent acceleration.

6. The apparatus recited in claim 1 wherein said vacuum chamber provides a vacuum pressure sufficiently low that collisional broadening does not exceed the selected magnitudes of state-dependent frequency shifts.

7. The apparatus recited in claim 1 wherein said motion detection comprises means for Fourier transform detection.

8. The apparatus recited in claim 7 wherein said detecting means further comprises means for dechirping a detected signal to extract the instantaneous frequency of said ion.

9. The apparatus recited in claim 1 further comprising means for determining the ion translational frequency shift resulting from the application of radiation resonant with one or more internal transitions of the ion.

10. The apparatus recited in claim 1 further comprising means for introducing ions into said ion trap.

11. A method for detecting magnetic resonance spectra of trapped ions; the method comprising the following steps:
    (a) exciting said ions;
    (b) subjecting said ions to an electromagnetic field gradient;
    (c) detecting the motion of said ions;
    (d) applying modulated irradiation resonant at internal transitions of said ions in synchrony with their translational oscillation;
    (e) turning off said electromagnetic field gradient;
    (f) irradiating internal transition(s) so as to selectively modify populations of certain internal states;
    (g) turning on said electromagnetic field gradient;
    (h) repeating step (d);
    (i) repeating step (c);
    (j) comparing the results of step (i) with the results of step (c).

12. The method recited in claim 11 wherein each of steps (c) and (i) is carried out by a Fourier transform technique.

13. The method recited in claim 12 wherein each of steps (c) and (i) further comprise the step of dechirping the detected signal.

14. The method recited in claim 11 further comprising the step of providing an ion trap including the trapping fields.

15. The method recited in claim 11 wherein step (a) comprises the step of exciting said ions to an orbit large enough to detect single ions by the induced charges on nearby electrodes.

16. The method recited in claim 11 wherein step (a) comprises the step of exciting said ions to an axial amplitude large enough to experience a range of fields which gives distinct motional frequencies to an ion before and after its state-dependent acceleration in step (d).

17. The method recited in claim 11 wherein step (b) comprises the step of creating an electromagnetic field gradient sufficient to resolve the internal spectroscopic transitions at different points in the ion trajectory and another or the same such gradient sufficient to resolve the difference in translational frequency of an ion before and after state-dependent acceleration given the axial amplitude of claim 16.

18. The method recited in claim 11 further comprising the step of subjecting said ions to a vacuum pressure sufficiently low that collisional broadening does not exceed the state-dependent frequency shifts which result from the choices of gradients and orbit sizes.

19. The method recited in claim 11 further comprising the step of determining the ion translational frequency shift of each of said ions resulting from the application of radiation resonant with one or more internal transitions of the ion.

20. The method recited in claim 11 further comprising the steps of: (1) turning off said electromagnetic field gradient; and repeating steps (a) through (j) for different selected irradiation conditions in step (f).

* * * * *